United States Patent [19]

Moe et al.

[11] Patent Number: 4,722,355

[45] Date of Patent: Feb. 2, 1988

[54] MACHINE AND METHOD FOR STRIPPING PHOTORESIST FROM WAFERS

[75] Inventors: Rolf Moe, c/o EKC Technology, Inc., P.O. Box 3703, Hayward, Calif. 94540; David Correia, Castro Valley, Calif.

[73] Assignee: Rolf Moe, Hayward, Calif.

[21] Appl. No.: 766,708

[22] Filed: Aug. 19, 1985

[51] Int. Cl.⁴ .............................................. B08B 3/08
[52] U.S. Cl. .................................. 134/73; 134/122 R; 134/131; 134/94; 198/626
[58] Field of Search .................... 134/61, 62, 64 R, 66, 134/67, 68, 70, 72, 73, 75, 76, 94, 99, 102, 131, 122 R, 124, 127, 133, 151; 198/626, 801, 802, 604, 607

[56] References Cited

U.S. PATENT DOCUMENTS

| | | | |
|---|---|---|---|
| 331,548 | 12/1885 | Reynolds, Jr. | 198/801 X |
| 626,956 | 6/1894 | Wrightson | 198/802 |
| 1,738,569 | 12/1929 | Fuller | 198/801 |
| 2,593,311 | 4/1952 | Johnson et al. | 134/127 X |
| 2,897,949 | 8/1959 | Huisking | 198/802 X |
| 3,421,211 | 1/1969 | Eaves et al. | 134/72 X |
| 4,185,649 | 1/1980 | Germain | 134/122 R |
| 4,282,825 | 8/1981 | Nagatomo et al. | 134/66 X |
| 4,318,749 | 3/1982 | Mayer | 134/30 X |
| 4,458,703 | 7/1984 | Inoue et al. | 134/64 R X |
| 4,561,144 | 12/1985 | Marais | 134/133 X |
| 4,569,695 | 2/1986 | Yamashita et al. | 15/77 X |
| 4,577,650 | 3/1986 | McConnell | 134/102 |

FOREIGN PATENT DOCUMENTS

| | | | |
|---|---|---|---|
| 59-31039 | 2/1984 | Japan | 134/133 |
| 60-5530 | 1/1985 | Japan | 134/66 |

Primary Examiner—Harvey C. Hornsby
Assistant Examiner—Frankie L. Stinson
Attorney, Agent, or Firm—Julian Caplan

[57] ABSTRACT

Photoresist baked upon integrated circuit wafers is mechanically stripped therefrom. Wafers are unloaded from boats at the top of an elevator within a vertical housing filled with stripper solution, then deposited on a conveyor and carried through a horizontal housing also filled with stripper. The wafers are sprayed by high pressure stripper pumped through a nozzle at the end of their horizontal travel. The wafers are then transferred to another housing where they are rinsed, dried and, optionally, reloaded.

10 Claims, 7 Drawing Figures

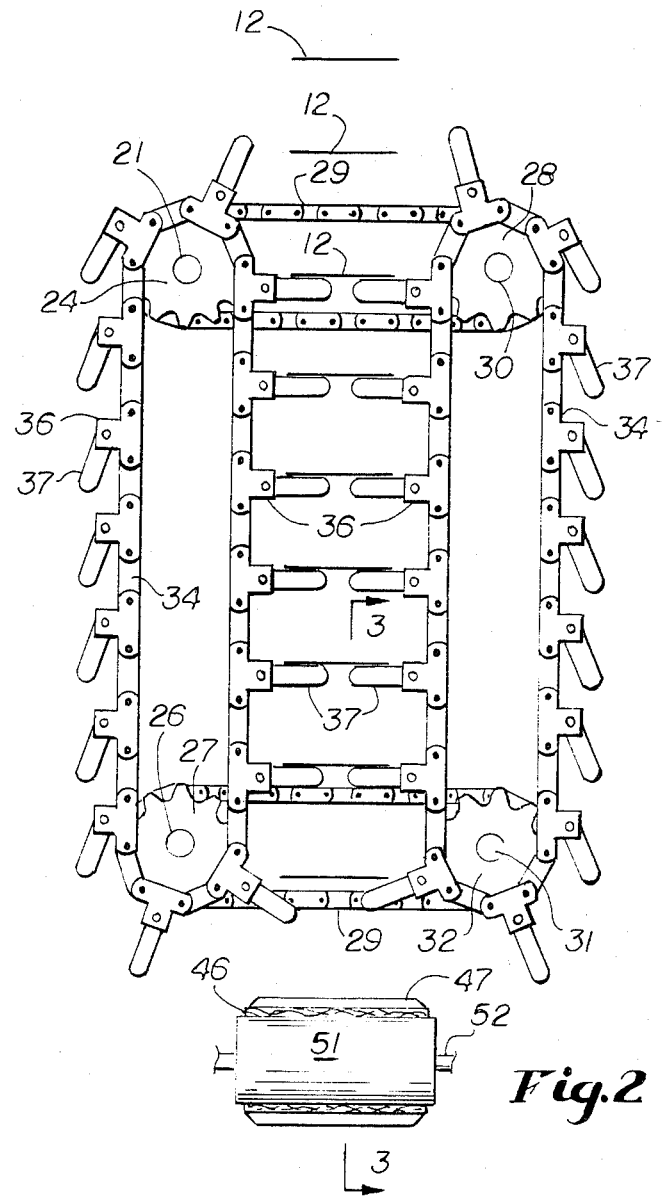
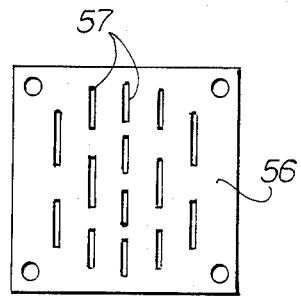
Fig.4
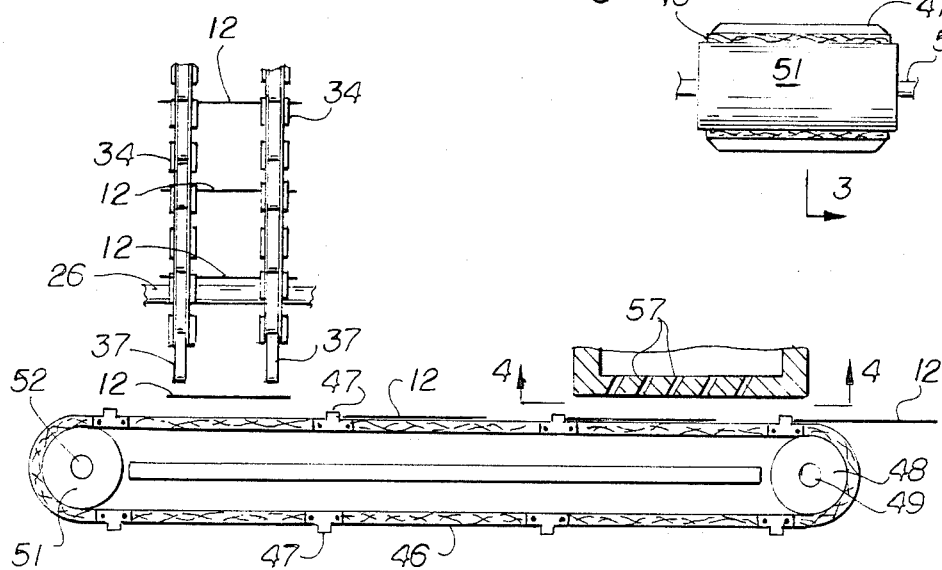
Fig.2
Fig.3

MACHINE AND METHOD FOR STRIPPING PHOTORESIST FROM WAFERS

BACKGROUND OF THE INVENTION

1. Field of the Invention

This invention relates to a new and improved machine and method for stripping photoresist from wafers. In the manufacture of integrated circuits, it is customary to bake a photoresist coating onto the wafer as part of the manufacturing process. Indeed, this step is repeated many times. Each coat of photoresist must be removed after processing. The present invention provides improved means and method for removing the baked photoresist.

2. Description of Related Art

Heretofore wafers have been loaded into trays, commonly termed "boats", containing many wafers. The boats with the wafers still retained therein have been treated in machines where a stripping solution is circulated around the wafers. The boats are then placed in rinsing and drying equipment. At all times the wafers remain in the boats and the boats are individually transferred from one piece of equipment to the other.

SUMMARY OF THE INVENTION

In accordance with the present invention, wafers are individually fed through the machine, being first soaked in stripping solution and then subjected to high pressure high volume flow of stripping solution over the wafer in a closed environment. The wafers then pass into another housing and are rinsed with alcohol or water and then are passed to another housing where they are dried with heated air or nitrogen. Thereupon the wafers are loaded into another station or back into a boat.

More particularly, stripping compound is delivered to a reservoir and heated to a temperature of approximately 100° C. Individual wafers are then transferred from boats (or other holders) into a descending elevator which is in a tower filled with circulating stripper solution. The elevator slowly lowers the wafers in the solution. The dwell time is dependent on the type of photoresist and/or bake temperatures or other conditions. At the bottom of the elevator the wafers are transferred onto a horizontal conveyor which moves it through stripper solution until the wafers pass a series of high pressure nozzles which pump stripper solution onto the wafers and remove any remaining photoresist. The wafers are then transported out of the stripper solution into a rinse chamber where they are sprayed with alcohol or water and the rinse cycle may be repeated several times. After rinsing, the wafers are transported through a heated air or nitrogen atmosphere until they are dried. The wafer is again loaded onto a continuing conveyor to the next station or back into a wafer cassette.

Other objects of the present invention will become apparent upon reading the following specification and referring to the accompanying drawings in which similar characters of reference represent corresponding parts in each of the several views.

In the drawings:

FIG. 2 is an enlarged fragmentary sectional view taken substantially along the line 2—2 of FIG. 1.

FIG. 3 is a fragmentary sectional view taken substantially along the line 3—3 of FIG. 2.

FIG. 4 is a bottom plan view of nozzles used in the stripping chamber as viewed along lines 4—4 of FIG. 3.

DESCRIPTION OF PREFERRED EMBODIMENT

Figure 1:
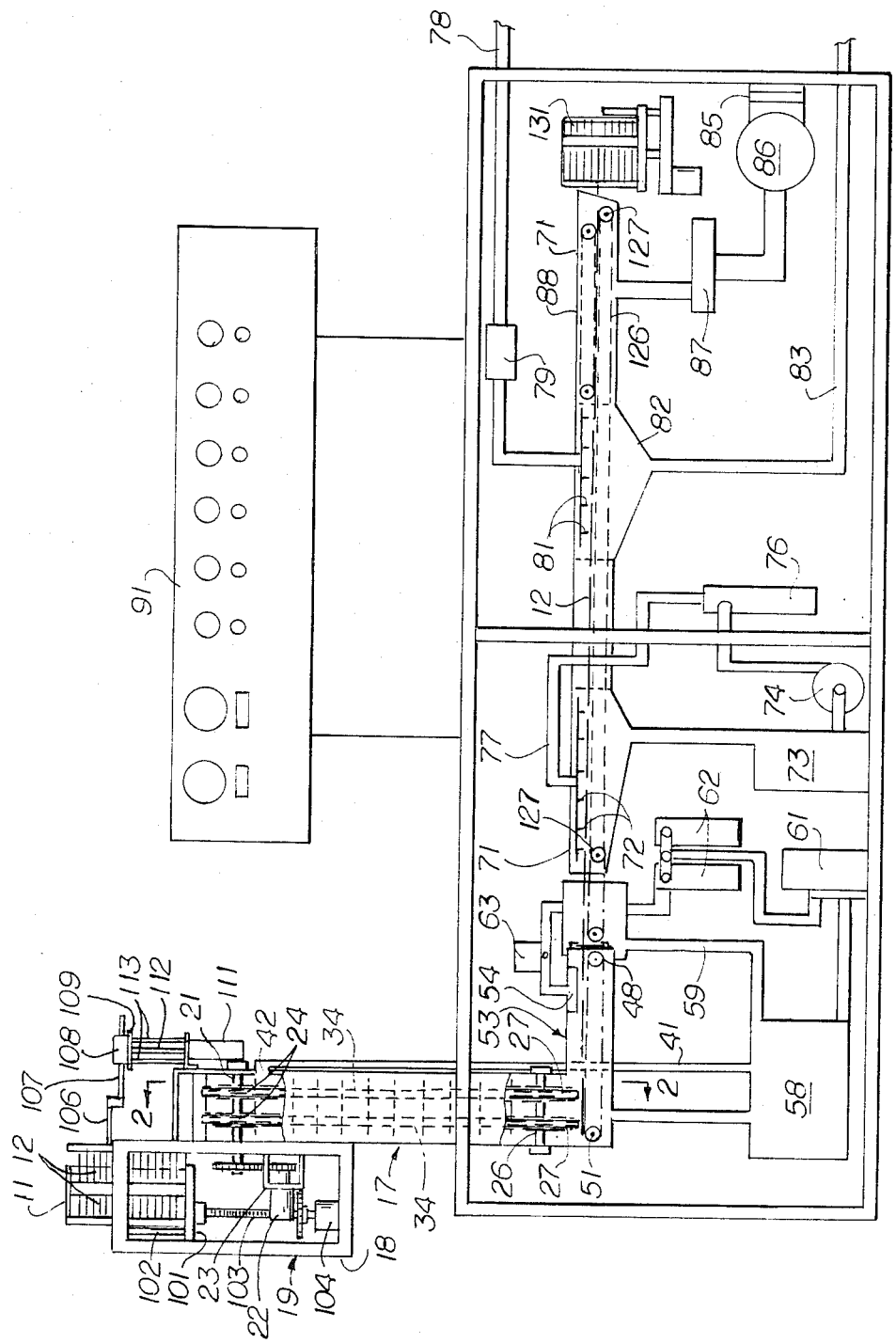
FIG. 1 is a schematic vertical sectional view through the system.

Cassettes or trays (i.e., "boats") 11 each contain a plurality of wafers 12 used in the manufacture of integrated circuits. It is assumed that the wafers 12 have been coated with baked photoresist. The function of the machine and apparatus hereinafter described is to remove the photoresist.

Various stripper compounds are commercially available; the present invention will function with any of these compounds. Preliminarily the stripper material is heated to a desired temperature such as 100° C.

The apparatus has a main casing 16 which is elongated horizontally. At the front end is an elevator extension 17 and disposed on one side of the extension 17 is an unloading mechanism housing 18. Disposed within the housing 18 is a commercially available cassette unloading mechanism 19.

One preferred mechanism 19 is illustrated in FIG. 1. Boat 11 is supported on a platform 101, the vertical reciprocation of which is guided by vertical guides 102. Screw 103 is attached to platform 101 and caused to turn in either direction by motor and drive 104. Thus, the boat 11 may be moved sequentially upward and downward the distance of one wafer. Arm 106 is caused to move both horizontally and vertically. Thus, the arm 106 is attached to the end of a cylinder rod 107 of cylinder 108. Cylinder 108 is, in turn, fixed to a support 109 which is caused to reciprocate vertically by means of a cylinder 111, the rod 112 which is affixed to the support 109. Arm or wand 106 is hollow and is connected to a source of vacuum. As the wand 106 moves into contact with the topmost wafer 12 in boat 11, it pulls the wafer to the right, as viewed in FIG. 1 to a position immediately over the middle of extension 17. Thereupon the cylinder 111 pulls the support 109 downwardly until the wafer is positioned in the middle of the extension 17.

Figure 7:
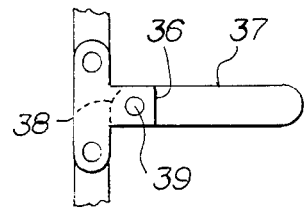
FIG. 7 is an enlarged elevational view of a portion of the elevator chain, the link thereof being partially broken away to reveal internal construction.

Mechanism 19 individually delivers wafers 12 into the elevator extension 17. Journaled in extension 17 are a pair of horizontally disposed drive shafts 21, one of which is driven by an adjustable speed motor 22 through a transmission 23. On shaft 21 is a pair of front drive sprockets 24. At the bottom of extension 26 are front idler shafts 26 upon which is mounted a pair of front idler sprockets 27. On the back of the extension 17 is a pair of rear drive sprockets 28 mounted on rear drive shaft 30. Connecting chains 29 through sprockets (not shown but well understood in the chain drive art) drive shafts 21 and 30 in synchronism and also drive rear idler shaft 32 in synchronism with front idler shaft 26. Rear idler sprockets 32 are mounted on shaft 31. Roller chains 34 are driven by the sprockets 24, 27, 28, 32. Spaced links of the chains 34 are provided with link extensions 36. Pivotal between links 36 on either side of chains 34 are Teflon ® fingers 37. As best shown in FIG. 7, one inner corner of each finger 37 is rounded to permit the fingers to pivot from the operative positions in the center of FIG. 2 to the inoperative positions shown on either side of FIG. 2. Pins 39 hold the fingers 37 in place between the links 36 and provide the pivot means. If space requirements are not a problem, the fingers may be fixed perpendicular to the links, rather than being pivotted.

The elevator extension is normally filled with stripper solution, there being an overflow tube 41 communicating with an opening 42 near the top of the extension 17 and continuing down to deliver overflow stripper solution into the bottom storage tank 58.

Extending across the stripper housing 53 is a horizontal metal chain 46 having spaced lugs 47 thereon. The chain 46 is driven by a drive sprocket 48 mounted on shaft 49. At the right end of the machine as viewed in FIG. 1 is a driven sprocket 48 for the chain 46. As wafers 12 are delivered from the elevator extension 17 they are deposited on the transport table 46, the lugs 47 individually moving the wafers away so that they pass through the housing 53 and continue to be soaked by the stripper solution. As the wafers approach the right end of housing 53 they pass under a spray head 54. The bottom 56 of head 54 is formed with slits 57 which are angled to the left as viewed in FIG. 1.

Stripper solution is delivered into a tank 58 from drains 59 from the housing 53. A tank 58 is initially filled with solution and any solution lost is made up as required. High pressure pump 61 draws the solution from the tank 58 and forces it through filters 62 and metering valve 63 to the spray head 54.

Figure 5:
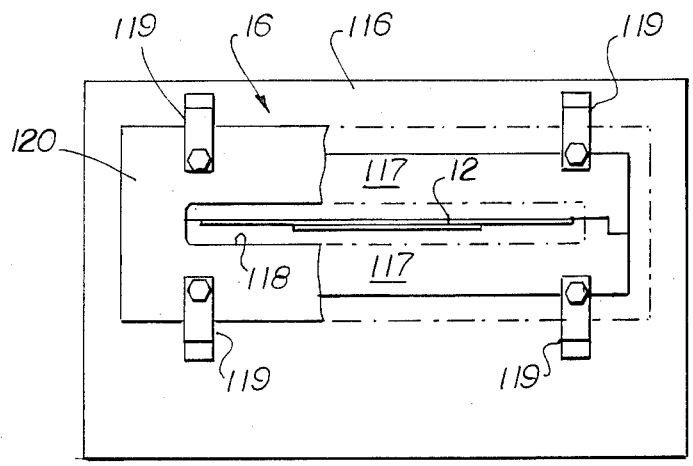
FIG. 5 is an end view of the main casing as viewed along lines 5—5 of FIG. 6.

As viewed in FIG. 5, at the right end of spray housing 53 is an end plate 116 apertured to permit egress of wafers 12. To accommodate different size wafers and to prevent unnecessary escape of stripper solution, a pair of adjustable plastic (e.g., Teflon) plates 117 partially closes opening 118 in plate 116. Over the plates 117 is a stainless steel plate 120 held in position by a plurality of clips 119. Thus wafers 12 reaching the end of chain 46 pass through the opening 118 between the plates 117. Whatever liquid flows through opening 118 is caught in a transfer casing 128 and returned to the tank 58.

Figure 6:
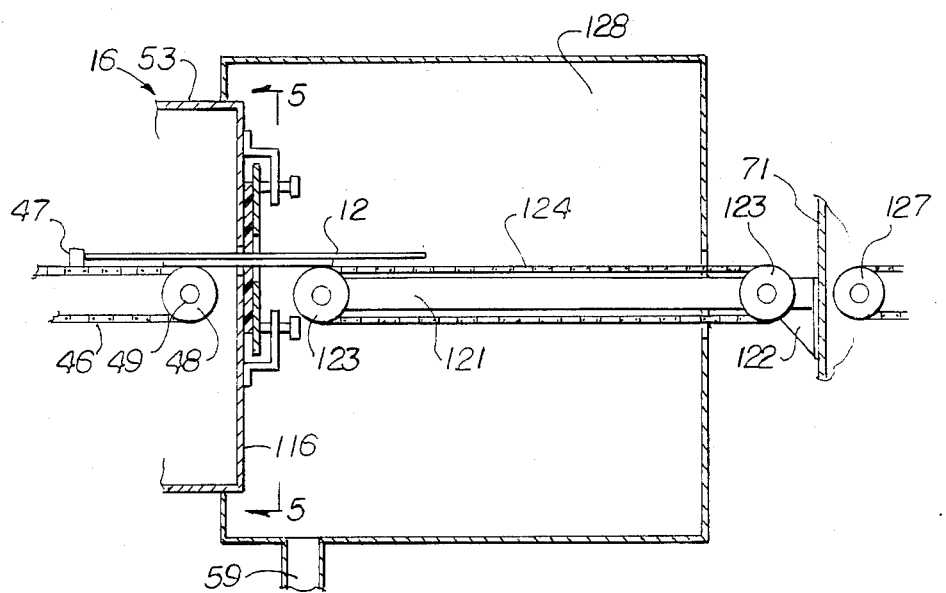
FIG. 6 is an enlarged sectional view of mechanism to transfer the wafer from the spray housing to the rinse housing.

Supported adjacent opening 118 is a transport arm 121, the left end of which supports the wafer 12 as it is discharged from the spray housing 116. In the form of the invention shown in FIG. 6, arm 121 is positioned by a bracket 122 fixed to rinse and dry housing 71. Arm 121 supports a plurality of rollers, or sprockets 123, around which pass chain 124 driven by means not shown but in timed relationship to drive of chain 46.

By the time the wafers have passed under the spray head 54, all of the photoresist has been washed away. The wafers then pass into a rinse housing 71. At the entrance to the housing 71 are spray heads 72. Alcohol or other solvent in tank 73 is pumped by pump 74 through filter 76 and pipe 77 to perform the first rinse on the wafers. It will be understood that instead of alcohol, water may be used. Furthermore, a number of spray heads may be installed depending upon the rinsing requirements. Wafers 12 are transported through housing 71 by lugged chain 126 supported and driven by sprockets 127.

The next step in cleaning the wafers is preferably by means of de-ionized water which enters through pipe 78 and is required by control valve 79 to flow through spray head 81 which sprays the wafers. Excess water is caught in catch through 82 and conducted to drain 83 after which it may be treated.

Drying is preferably accomplished by means of air drawn in through fan 86, the air being filtered by filter 85, heated by heater 87 and blown around the wafers in drier section 88.

At the remote end of rinse-dryer housing 71 is positioned a boat 131, which receives the wafers 12 as they are discharged from the chain 126. Boat 131 is preferably supported by a commercially available send/receive elevator 132, the details of which are not illustrated or described herein because they are well understood in the wafer handling art. One suitable elevator is Model 2660 sold by Siltec Corporation, Siltec Instrument Division.

Method of Stripping

In accordance with the present invention, wafers 12 having photoresist baked thereon are fed into the down elevator 17, being separated from each other so that they may be thoroughly soaked as they pass down through the stripper solution in the elevator 17. At the bottom of the elevator, the wafers are individually delivered onto a belt, still being immersed in stripper solution so that all of the photoresist is loosened therefrom. The wafers then pass under the spray head 54 where high pressure high volume fluid is forced across the surface of the wafer, removing any photoresist which may remain thereon. The stripper solution is recycled by high pressure pump through the filters as required. The control panel 91 shows the temperature of the stripper material and of the air, the pressure of air and nitrogen etc. Hence the operator may control the speed of the drive of the elevator and of the horizontal belt. The wafers then pass under one or more spray heads to be sprayed with alcohol and/or de-ionized water and are then dried with hot air or nitrogen and may be transferred to another conveyor for further processing or may be reloaded into cassettes.

What is claimed is:

1. A machine for stripping photoresist deposited on one side of integrated circuit wafers by use of a stripper solvent comprising an elongated first housing, an extension at one end of and generally perpendicular to said first housing, a wafer elevator in said extension for transporting wafers from the outer to the inner end of said extension, feeder means at said outer end for feeding wafers one at a time from a wafer container onto said wafer elevator, a first conveyor extending longitudinally of said first housing, means for continuously advancing said first conveyor, said wafer elevator being positioned to deposit wafers one at a time resting on said first conveyor with said one side of said wafers uppermost, a second housing around said first conveyor, means for maintaining said wafer elevator and said second housing substantially full of stripper solvent, a spray head within said second housing in proximity to said first conveyor remote from said wafer elevator, said head having a bottom formed with slots, pump means for pumping solvent under pressure through said spray head, out said slots and against said one side of said wafers as they travel on said first conveyor in proximity to said spray head while said wafers are immersed in stripper solvent to flush photoresist off said one side of said wafers, a third housing extending longitudinally of said first housing beyond said second housing, a second conveyor in said third housing, means for continuously advancing said second conveyor, transfer means for transferring wafers from said first to said second conveyor, rinsing and drying means in said third housing above said second conveyor, and discharge means for discharging wafers from the end of said second conveyor remote from said first conveyor.

2. A machine according to claim 1 in which said wafers are initially stored in boats and in which said feeder means comprises means to receive one said boat, means to move said boat parallel to said wafer elevator, an arm having grip means to grip one said wafer in said boat and move said wafer out of said boat and over said elevator and then release said wafer, said grip means being mounted and driven to be moved in a first direction transverse to said boat and then in a second direction parallel to said elevator and over said elevator, said wafer elevator comprising a plurality of link chains and sprockets, means for driving said sprockets and thereby said chains, said chains having fingers attached at spaced intervals to links of said chains, at least one pair of said chains being opposed and having said links aligned and extending toward each other to support a wafer deposited on top of opposed links, each said finger being pivoted to said chain and movable from a position generally in line with said chain along a first stretch of movement of said chain and perpendicular to said chain along a second stretch opposite said first stretch.

3. A machine according to claim 2 in which said grip means is vacuum controlled, and is driven by a pair of reciprocating members positioned at right angles to each other.

4. A machine according to claim 1 in which said slots in said bottom of said spray head are angled so that stripper forced by said pump means out said slots is forced across said wafers to drive photoresist on said wafers off the surface of said wafers.

5. A machine according to claim 1 in which said second housing has an end remote from said elevator formed with an opening generally complementary to said wafers but larger than said wafers, a pair of plates positioned on opposite sides of said opening, clamp means for adjustably positioning said plates relative to said opening to restrict out-flow of stripper from said opening and a catch basin to receive stripper escaping from said opening.

6. A machine according to claim 1 in which said transfer means comprises a third conveyor supported between said first and second conveyors located so that wafers discharged from said first conveyor are moved onto said third conveyor.

7. A machine according to claim 1 in which said drying means comprises a fan, a duct for drawing air from outside said third housing, a filter for said air, a heater for said air, means for directing heated, filtered air from said duct onto said wafers, and a vent for discharging air from said third housing.

8. A machine according to claim 1 which further comprises a second boat, means for positioning said second boat at the distal end of said third housing, said last-named means comprising a send-receive elevator.

9. In a machine for stripping photoresist deposited on a first side of integrated circuit wafers by use of a stripper solvent, comprising a housing, a conveyor for advancing said wafers through said housing, drive means for advancing said conveyor in a first direction, feeder means for feeding said wafers one at a time into said housing with a second side of said wafers opposite said first side resting on said conveyor, means for maintaining said housing substantially full of solvent so that said wafers are immersed in said solvent for at least a substantial portion of their path of travel on said conveyor, a spray head in said housing immersed in said solvent located adjacent the end of said substantial portion of the path of travel of said wafers in proximity to said path of travel, said head having a flat bottom parallel to said conveyor formed with substantially rectangular slits elongated in a second direction transverse to said first direction, pump means for pumping solvent under pressure into said head, out of said apertures and against said one side of said wafers as they travel immersed in solvent under said head along said conveyor to flush photoresist off said first side of said wafers, said slits being disposed in a pattern substantially as wide as said conveyor, there being a plurality of rows of slits disposed in said first direction, and discharge means for discharging wafers from said conveyor.

10. A machine according to claim 9, wherein said bottom of said spray head has a substantially planar outer surface and said slots are disposed at an acute angle to said planar outer surface and are directed in a direction opposite said first direction when viewed in section along a plane parallel to said first direction and perpendicular to said bottom surface.

* * * * *